United States Patent
Wu et al.

(10) Patent No.: US 11,143,529 B2
(45) Date of Patent: Oct. 12, 2021

(54) CANTILEVER LINEAR MOTION REFERENCE DEVICE EMPLOYING TWO-LAYER AIR SUSPENSION

(71) Applicant: Harbin Institute of Technology, Harbin (CN)

(72) Inventors: JianWei Wu, Harbin (CN); ZhongPu Wen, Harbin (CN); PengCheng Hu, Harbin (CN); Yin Zhang, Harbin (CN); JiWen Cui, Harbin (CN); JiuBin Tan, Harbin (CN)

(73) Assignee: HARBIN INSTITUTE OF TECHNOLOGY, Harbin (CN)

( * ) Notice: Subject to any disclaimer, the term of this patent is extended or adjusted under 35 U.S.C. 154(b) by 0 days.

(21) Appl. No.: 16/973,552

(22) PCT Filed: Nov. 12, 2018

(86) PCT No.: PCT/CN2018/114970
§ 371 (c)(1),
(2) Date: Dec. 9, 2020

(87) PCT Pub. No.: WO2019/214197
PCT Pub. Date: Nov. 14, 2019

(65) Prior Publication Data
US 2021/0247216 A1    Aug. 12, 2021

(30) Foreign Application Priority Data
May 9, 2018   (CN) .......................... 201810437738.2

(51) Int. Cl.
*G01D 5/38* (2006.01)
*F16C 32/06* (2006.01)
*G03F 7/20* (2006.01)

(52) U.S. Cl.
CPC ............ *G01D 5/38* (2013.01); *F16C 32/0607* (2013.01); *G03F 7/70758* (2013.01); *G03F 7/70775* (2013.01); *F16C 2370/00* (2013.01)

(58) Field of Classification Search
CPC ... G01D 5/38; G03F 7/70775; G03F 7/70758; F16C 32/0607; F16C 2370/00
See application file for complete search history.

(56) References Cited

U.S. PATENT DOCUMENTS

2005/0236908 A1* 10/2005 Rivin .................. G03F 7/70766
310/10
2005/0255624 A1* 11/2005 Miyajima ........... G03F 7/70725
438/48

FOREIGN PATENT DOCUMENTS

CN        1701925 A   * 11/2005
CN      103062284 A   *  4/2013
(Continued)

OTHER PUBLICATIONS

English machine translation of CN1701925A (Year: 2005).*
(Continued)

*Primary Examiner* — Dominic J Bologna
(74) *Attorney, Agent, or Firm* — IPro, PLLC

(57) ABSTRACT

A cantilever linear motion reference device employing two-layer air suspension. By means of a two-layer force sealed air suspension structure, the invention realizes two-dimensional air suspension support and motion guiding and improves the rotational stiffness per unit for an air suspension working surface. By combining accurate driving and feedback control, the invention achieves high speed, high acceleration, high frequency motion, and enables construction of a small-volume, long cantilever, high torque load two-dimensional motion reference device.

4 Claims, 1 Drawing Sheet

(56) References Cited

FOREIGN PATENT DOCUMENTS

JP            11166990 A   *   6/1999
JP       2004342987 A   *   12/2004   ........ G03F 7/70716

OTHER PUBLICATIONS

English machine translation of CN103062284A (Year: 2015).*
English machine translation of JP2004342987A (Year: 2004).*
English machine translation of JPH11166990A (Year: 1999).*

* cited by examiner

CANTILEVER LINEAR MOTION REFERENCE DEVICE EMPLOYING TWO-LAYER AIR SUSPENSION

TECHNICAL FIELD

The invention belongs to the technical fields of precision instrument and machinery, and particularly relates to a cantilever linear motion reference device employing two-layer air suspension.

BACKGROUND

In recent years, as the advanced chip manufacturing industry gradually develops towards functional integration and volume miniaturization, the aerostatic linear motion reference device has become one of the key components in the cutting-edge lithography machine because of its remarkable advantages such as high speed and high precision. The high speed, high acceleration, and high motion precision of the diaphragm in the exposure system of the lithography machine require high support capacity and high rotational stiffness of the aerostatic rail in the aerostatic linear motion reference device. In order to prevent the linear motion mechanism from blocking the optical path or touching optics, the diaphragm is disposed at the cantilever end of the linear motion reference device, so it is necessary to improve the rotational stiffness of the aerostatic rail to resist the rotational torque generated when the diaphragm moves at high acceleration. However, the exposure system of the lithography machine is complex and precise, and its aerostatic linear motion mechanism needs to be miniaturized. Therefore, how to improve the rotational stiffness per unit area becomes a major technical problem that restricts the application of the aerostatic rail in the exposure system of the lithography machine.

In 2008, the Twinscan XT 19501 type lithography machine developed by ASML in the Netherlands can achieve laser etching of 38-nm chips. The linear motion reference device in its exposure system adopts a mechanical rail structure and achieves an acceleration motion of 40 m/s$^2$ (Y. B. Patrick Kwan, Erik L. Loopstra. Nullifying Acceleration Forces in Nano-Positioning Stages for Sub-0.1 mm Lithography Tool for 300 mm Wafers [J]. proceeding of SPIC: Optical Microlithography, 2010, 4346: 544-557). However, with the development of the chip manufacturing industry, traditional sliding/rolling rails are difficult to meet the requirements of high acceleration motion and working temperature stability.

Patent CN201220540610 "Two-dimensional frictionless long-distance motion multi-layer air suspension hanging device" proposes an air-suspension-oriented hanging type motion device, which mainly includes a single-layer hanging device and an unfolding experiment rack. The single-layer hanging device includes a support part, an air suspension follow-up part, a detection part and a rail system. The air suspension follow-up part includes a longitudinal air suspension sleeve, two horizontal air suspension sleeves, two air suspension seats, a telescopic air pipe, a horizontal air suspension shaft and hanging tooling. This device can achieve large-displacement and long-distance follow-up motion, and meet cooperated motion between multi-layer hanging devices. However, this device is a follow-up motion device, which cannot guarantee the motion accuracy; and moreover, this device needs to be disposed on the unfolding experiment rack for use, and the structure is not compact enough.

Patent CN201310436356 "Air suspension hanging type three-dimensional unfolding experiment device" proposes a three-dimensional motion device with high positioning accuracy and fast response speed, which mainly includes a dozen air suspension motion mechanisms that are spatially correspondingly distributed, and disposed inside a support frame with the help of mechanisms such as pulleys, slings, and counterweights. This device can meet certain motion accuracy. However, due to a large number of motion links, the output end cannot ensure fast and accurate displacement response in the high-frequency motion state, and the structure is not compact enough.

Patent CN201410839808 "Grating ruling tool rest driving device with two air-suspended rails" proposes a small one-dimensional motion device, which mainly includes two sets of air-suspended rails disposed in parallel, and the motion stability of the ruling tool rest is improved by being fixed to air suspension sliding sleeves. This device can achieve high speed and high frequency motion. However, compared with the displacement output end of this device, such as the tool rest adapter plate and the ruling tool rest, the air-suspended rails are too large, so the rotational stiffness per unit area is poor, and a tool rest counterweight is required to maintain balance.

Patent CN201610130635 "Double-sided air suspension transport platform" and patent CN201710832517 "Motion platform based on H-type air-suspended rails" respectively propose air suspension devices that realize two-dimensional motion, which can achieve higher motion and positioning accuracy while taking stability into account. However, the use methods of the two devices are both of mount type, which cannot be used in suspended or cantilevered motion occasions, and the volume is too large for the exposure system of the lithography machine.

The common feature of the above-mentioned inventions is that the small air-suspended rails cannot be applied to high speed, high acceleration, and high frequency motion occasions. However, in the exposure system of the lithography machine, the high-speed and high-precision motion of the diaphragm is achieved by air suspension support and motion guiding, so the support and rotational stiffness of the linear air-suspended rail per unit area needs to be improved, and thereby the reliability and accuracy of the cantilever linear motion reference device are improved.

SUMMARY

An objective of the invention is to solve the above-mentioned problems in the prior art, and propose a cantilever linear motion reference device employing two-layer air suspension. By means of a two-layer force sealed air suspension structure, the invention realizes two-dimensional air suspension support and motion guiding and improves the rotational stiffness per unit of an air suspension working surface. By combining accurate driving and feedback control, the invention achieves high speed, high acceleration, high frequency motion.

The above objective is achieved through the following technical solution:

A cantilever linear motion reference device employing two-layer air suspension includes a two-layer air suspension sliding sleeve component, a vertical drive motor, a vertical rail, a driven rail, and a suspended counterweight component. The vertical rail and the vertical drive motor are disposed on a back plate. The two-layer air suspension sliding sleeve component is fixedly connected to a motor coil via an adapter. The vertical rail and the driven rail are disposed in the two-layer air suspension sliding sleeve component. The suspended counterweight component is disposed at a cantilever end of the horizontal driven rail. The two-layer air suspension sliding sleeve component consists of a U-shaped bottom plate, a middle plate, and a U-shaped cover plate. The U-shaped bottom plate and the middle plate are disposed in cooperation with each other, and connected with each other via a bottom air-sealing screw. The vertical rail is disposed between the U-shaped bottom plate and the middle plate to form a force sealed air suspension structure. The middle plate and the U-shaped cover plate are disposed in cooperation with each other, and connected with each other via a top air-sealing screw. The driven rail is disposed between the middle plate and the U-shaped cover plate to form a force sealed air suspension structure. A grating ruler component is disposed on the two-layer air suspension sliding sleeve component. A displacement reading head used in cooperation with the grating ruler component is disposed on the vertical drive motor via a pitch adjustment seat and a position adjustment seat. A horizontal drive device is disposed on the two-layer air suspension sliding sleeve component, and connected to the horizontal driven rail via a transmission component. A lower end of the vertical rail is disposed on the back plate via a fixed base, and an upper end of the vertical rail is disposed on the back plate via an adjustable base.

The horizontal drive device drives the driven rail to move in a horizontal direction via the transmission component. When the vertical drive motor drives the motor coil to drive the two-layer air suspension sliding sleeve component and the grating ruler component to move in a vertical direction, the driven rail and the suspended counterweight component form a cantilever structure and move accordingly.

The vertical displacement of the two-layer air suspension sliding sleeve component is subjected to measurement and feedback control via cooperation of the grating ruler component and the displacement reading head.

The displacement reading head is capable of being adjusted in 3 degrees of freedom via the pitch adjustment seat and the position adjustment seat. The vertical rail is capable of being adjusted in 2 degrees of freedom via the fixed base and the adjustable base.

The invention has the following characteristics and beneficial effects:

1. The two-layer air suspension sliding sleeve component in the device of the invention includes the U-shaped bottom plate, the middle plate, and the U-shaped cover plate, which can realize two-dimensional air suspension support and motion guiding, reduce friction and heat loss, improve the motion accuracy, and increase the motion stroke. The two-layer air suspension sliding sleeve component is used in cooperation with the vertical rail, the driven rail, and the suspended counterweight component, which can improve the rotational stiffness per unit area, while imparting advantages such as small volume, long cantilever, and high torque load to the device.

2. The pitch adjustment seat, the position adjustment seat, and the adjustable base included in the device of the invention can adjust the device in multiple degrees of freedom, ensuring that the device itself has high-precision adjustment and positioning functions in the assembly and calibration stage, and can trace to a higher linear reference.

3. When the device of the invention is in use, the grating ruler component and the corresponding displacement reading head cooperate with each other to measure the relative displacement of the two-layer air suspension sliding sleeve component, and feedback control is performed via the vertical drive motor, so that accurate positioning of the output end in the high-speed and high-frequency motion state is achieved.

The device of the invention is widely used, and is especially suitable for high-speed, high-frequency and high-precision motion occasions of a small cantilever mechanism in the exposure system of the lithography machine.

Figure 1:
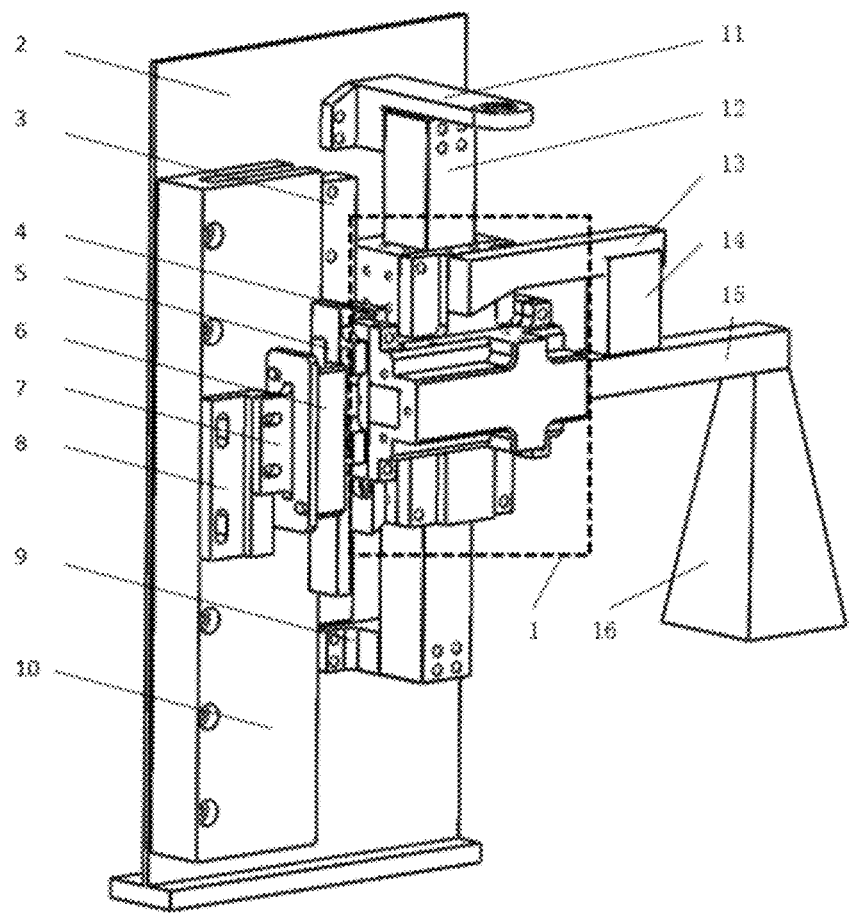
FIG. 1 is a schematic diagram of a cantilever linear motion reference device employing two-layer air suspension.

In the drawings, 1 denotes a two-layer air suspension sliding sleeve component; 2 denotes a back plate; 3 denotes a motor coil; 4 denotes an adapter; 5 denotes a grating ruler component; 6 denotes a displacement reading head; 7 denotes a pitch adjustment seat; 8 denotes a position adjustment seat; 9 denotes a fixed base; 10 denotes a vertical drive motor; 11 denotes an adjustable base; 12 denotes a vertical rail; 13 denotes a horizontal drive device; 14 denotes a transmission component; 15 denotes a driven rail; 16 denotes a suspended counterweight component; 17 denotes a U-shaped bottom plate; 18 denotes a middle plate; 19 denotes a U-shaped cover plate; 20 denotes a bottom air-sealing screw; and 21 denotes a top air-sealing screw.

DETAILED DESCRIPTION

Embodiments of the invention are described in detail below with reference to the accompanying drawings.

Referring to FIG. 1, a cantilever linear motion reference device employing two-layer air suspension includes a two-layer air suspension sliding sleeve component 1, a vertical drive motor 10, a vertical rail 12, a driven rail 15, and a suspended counterweight component 16. The vertical rail 12 and the vertical drive motor 10 are disposed on a back plate 2. The two-layer air suspension sliding sleeve component 1 is fixedly connected to a motor coil 3 via an adapter 4. The vertical rail 12 and the driven rail 15 are disposed in the two-layer air suspension sliding sleeve component 1. The suspended counterweight component 16 is disposed at a cantilever end of the driven rail 15. A grating ruler component 5 is disposed on the two-layer air suspension sliding sleeve component 1. A displacement reading head 6 used in cooperation with the grating ruler component is disposed on the vertical drive motor 10 via a pitch adjustment seat 7 and a position adjustment seat 8. A horizontal drive device 13 is disposed on the two-layer air suspension sliding sleeve component 1, and connected to the driven rail 15 via a transmission component 14. A lower end of the vertical rail 12 is disposed on the back plate 2 via a fixed base 9, and an upper end of the vertical rail 12 is disposed on the back plate 2 via an adjustable base 11.

Figure 2:
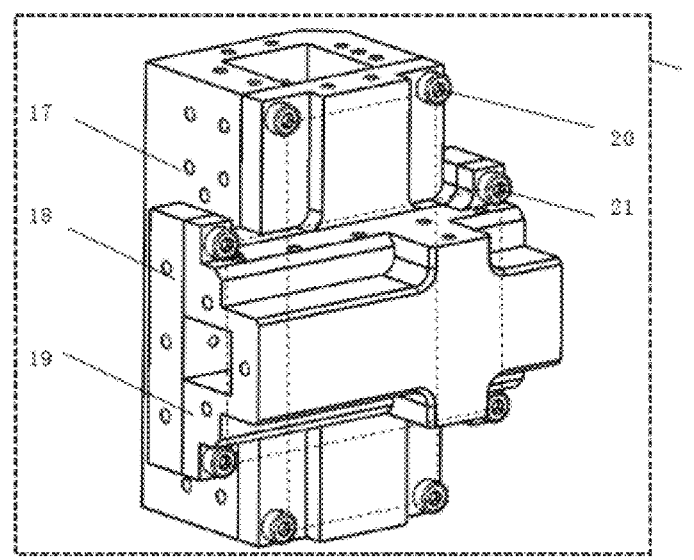
FIG. 2 is a schematic diagram of a two-layer air suspension sliding sleeve component.

Referring to FIG. 2, the two-layer air suspension sliding sleeve component 1 consists of a U-shaped bottom plate 17, a middle plate 18, and a U-shaped cover plate 19. The U-shaped bottom plate 17 and the middle plate 18 are disposed in cooperation with each other, and connected with each other via four bottom air-sealing screws 20. The vertical rail 12 is disposed between the U-shaped bottom plate 17 and the middle plate 18 to form a force sealed air suspension structure. The middle plate 18 and the U-shaped cover plate 19 are disposed in cooperation with each other, and connected with each other via four top air-sealing screws 21. The driven rail 15 is disposed between the middle plate 18 and the U-shaped cover plate 19 to form a force sealed air suspension structure.

With the two-layer air suspension sliding sleeve component 1 as the core of motion, the cantilever linear motion reference device employing two-layer air suspension can realize the functions of support and motion guiding, drive control, and measurement feedback. The support and motion guiding function is realized via the two-layer air suspension sliding sleeve component 1, the vertical rail 12, and the driven rail 15. The drive control function is realized via the vertical drive motor 10 and the horizontal drive device 13. The measurement feedback function is realized via the grating ruler component 5 and the displacement reading head 6.

In the assembly and calibration stage of the cantilever linear motion reference device employing two-layer air suspension, the displacement reading head 6 is capable of being adjusted in 3 degrees of freedom via the pitch adjustment seat 7 and the position adjustment seat 8. The vertical rail 12 is capable of being adjusted in 2 degrees of freedom via the fixed base 9 and the adjustable base 11. The abovementioned high-precision adjustment and positioning functions enable the cantilever linear motion reference device employing two-layer air suspension to calibrate the device itself by tracing to a higher linear reference.

In the use stage of the cantilever linear motion reference device employing two-layer air suspension, the horizontal drive device 13 drives the driven rail 15 to move in a horizontal direction via the transmission component 14, and when the vertical drive motor 10 drives the motor coil 3 to drive the two-layer air suspension sliding sleeve component 1 and the grating ruler component 5 to move in a vertical direction, the driven rail 15 and the suspended counterweight component 16 form a cantilever structure and move accordingly.

What is claimed is:

1. A cantilever linear motion reference device employing two-layer air suspension, comprising a two-layer air suspension sliding sleeve component (1), a vertical drive motor (10), a vertical rail (12), a driven rail (15), and a suspended counterweight component (16), the vertical rail (12) and the vertical drive motor (10) being disposed on a back plate (2), the two-layer air suspension sliding sleeve component (1) being fixedly connected to a motor coil (3) via an adapter (4), the vertical rail (12) and the driven rail (15) being disposed in the two-layer air suspension sliding sleeve component (1), and the suspended counterweight component (16) being disposed at a cantilever end of the driven rail (15), wherein the two-layer air suspension sliding sleeve component (1) consists of a U-shaped bottom plate (17), a middle plate (18), and a U-shaped cover plate (19); the U-shaped bottom plate (17) and the middle plate (18) are disposed in cooperation with each other, and connected with each other via a bottom air-sealing screw (20); the vertical rail (12) is disposed between the U-shaped bottom plate (17) and the middle plate (18) to form a force sealed air suspension structure; the middle plate (18) and the U-shaped cover plate (19) are disposed in cooperation with each other, and connected with each other via a top air-sealing screw (21); the driven rail (15) is disposed between the middle plate (18) and the U-shaped cover plate (19) to form a force sealed air suspension structure; a grating ruler component (5) is disposed on the two-layer air suspension sliding sleeve component (1); a displacement reading head (6) used in cooperation with the grating ruler component is disposed on the vertical drive motor (10) via a pitch adjustment seat (7) and a position adjustment seat (8); a horizontal drive device (13) is disposed on the two-layer air suspension sliding sleeve component (1), and connected to the driven rail (15) via a transmission component (14); and a lower end of the vertical rail (12) is disposed on the back plate (2) via a fixed base (9), and an upper end of the vertical rail (12) is disposed on the back plate (2) via an adjustable base (11); and the horizontal drive device (13) drives the driven rail (15) to move in a horizontal direction via the transmission component (14); and when the vertical drive motor (10) drives the motor coil (3) to drive the two-layer air suspension sliding sleeve component (1) and the grating ruler component (5) to move in a vertical direction, the driven rail (15) and the suspended counterweight component (16) form a cantilever structure and move accordingly.

2. The cantilever linear motion reference device employing two-layer air suspension according to claim 1, wherein the vertical displacement of the two-layer air suspension sliding sleeve component (1) is subjected to measurement and feedback control via cooperation of the grating ruler component (5) and the displacement reading head (6).

3. The cantilever linear motion reference device employing two-layer air suspension according to claim 1, wherein the displacement reading head (6) is capable of being adjusted in 3 degrees of freedom via the pitch adjustment seat (7) and the position adjustment seat (8).

4. The cantilever linear motion reference device employing two-layer air suspension according to claim 1, wherein the vertical rail (12) is capable of being adjusted in 2 degrees of freedom via the fixed base (9) and the adjustable base (11).

* * * * *